(12) United States Patent
Sugiura et al.

(10) Patent No.: US 7,434,111 B2
(45) Date of Patent: Oct. 7, 2008

(54) NON-VOLATILE MEMORY SYSTEM HAVING A PSEUDO PASS FUNCTION

(75) Inventors: Yoshihisa Sugiura, Kamakura (JP);
Tatsuya Tanaka, Yokohama (JP);
Atsushi Inoue, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 289 days.

(21) Appl. No.: 11/097,188

(22) Filed: Apr. 4, 2005

(65) Prior Publication Data
US 2006/0117214 A1    Jun. 1, 2006

(30) Foreign Application Priority Data
Nov. 5, 2004    (JP) .............................. 2004-322718

(51) Int. Cl.
*G06F 11/00*    (2006.01)
(52) U.S. Cl. .............................. 714/48; 714/5; 714/704; 714/705; 711/102; 711/103; 365/185.09; 365/200
(58) Field of Classification Search .............. 714/5, 714/48, 704, 705; 711/102, 103; 365/185.09, 365/200
See application file for complete search history.

(56) References Cited

U.S. PATENT DOCUMENTS

| | | | |
|---|---|---|---|
| 5,974,576 A * | 10/1999 | Zhu ............................ | 714/704 |
| 6,185,134 B1 * | 2/2001 | Tanaka ................... | 365/185.33 |
| 6,256,762 B1 * | 7/2001 | Beppu ........................ | 714/763 |
| 6,339,546 B1 * | 1/2002 | Katayama et al. ....... | 365/185.09 |
| 6,345,001 B1 * | 2/2002 | Mokhlesi ............... | 365/185.33 |
| 6,507,518 B2 | 1/2003 | Hosono et al. | |
| 6,549,459 B2 * | 4/2003 | Higuchi ................. | 365/185.09 |
| 7,137,027 B2 * | 11/2006 | Shiota et al. ................... | 714/5 |
| 2006/0117214 A1 | 6/2006 | Sugiura et al. | |

FOREIGN PATENT DOCUMENTS

JP    3178912    4/2001

OTHER PUBLICATIONS

U.S. Appl. No. 11/538,689, filed Oct. 4, 2006, Kojima.

* cited by examiner

*Primary Examiner*—Kevin Ellis
*Assistant Examiner*—Alan M Otto
(74) *Attorney, Agent, or Firm*—Oblon, Spivak, McClelland, Maier & Neustadt, P.C.

(57) ABSTRACT

A non-volatile memory system comprises a non-volatile memory and a memory controller controlling the non-volatile memory. The non-volatile memory has a pseudo pass function of returning a pass as a status even if a bit error reaching allowable number of bits occurs after at least one of a write or erase sequence is completed. The memory controller has an allowable bit change function of changing the upper limit value of the allowable number of bits.

20 Claims, 13 Drawing Sheets

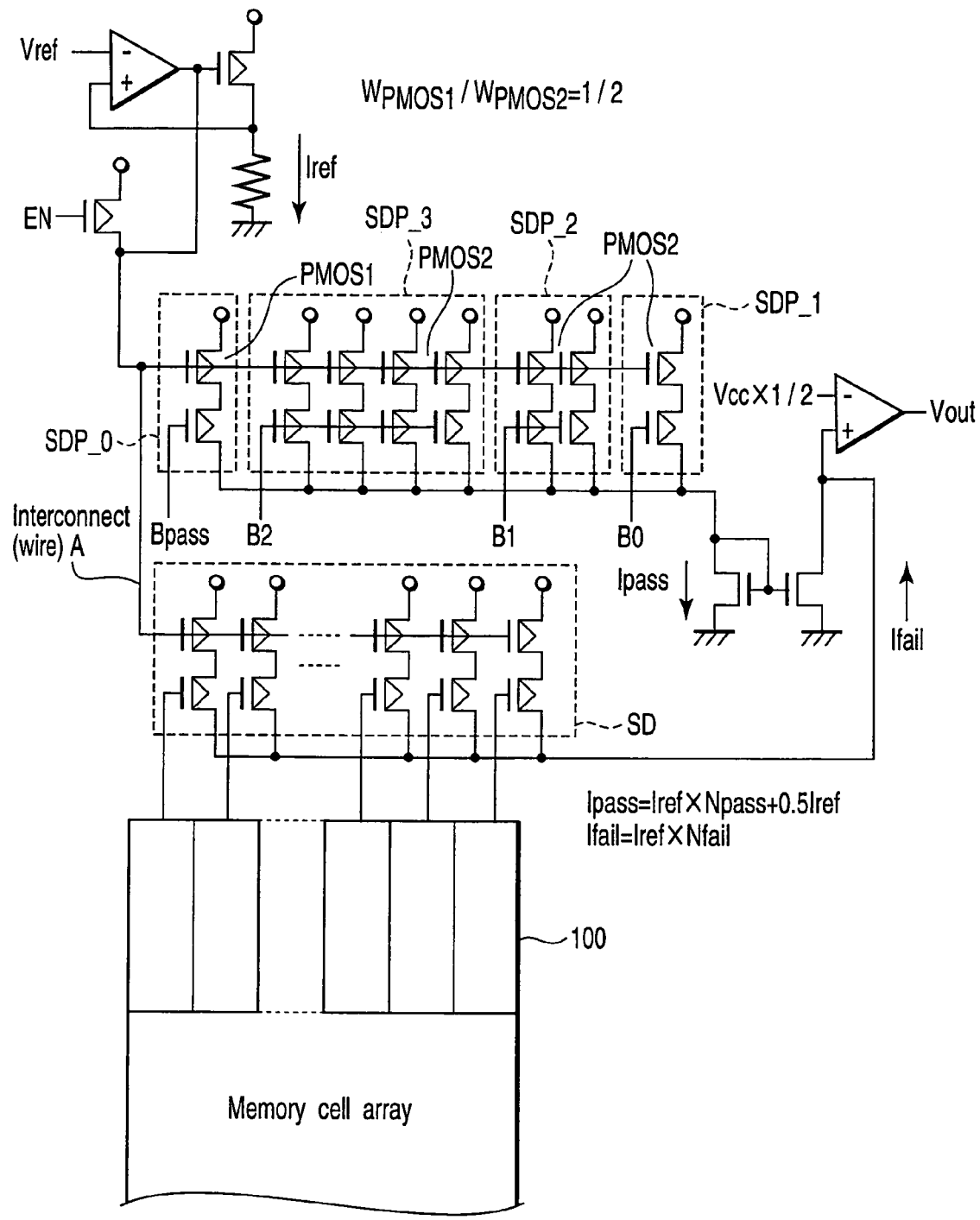
F I G. 1

Internal waveform in the case where the number of bit errors occurring in one page is two bits.

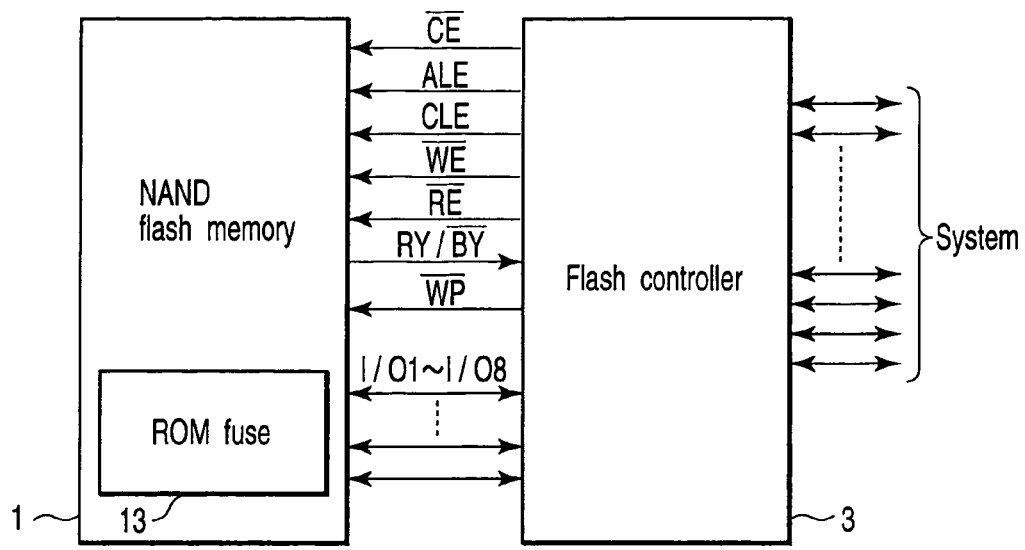
F I G. 3
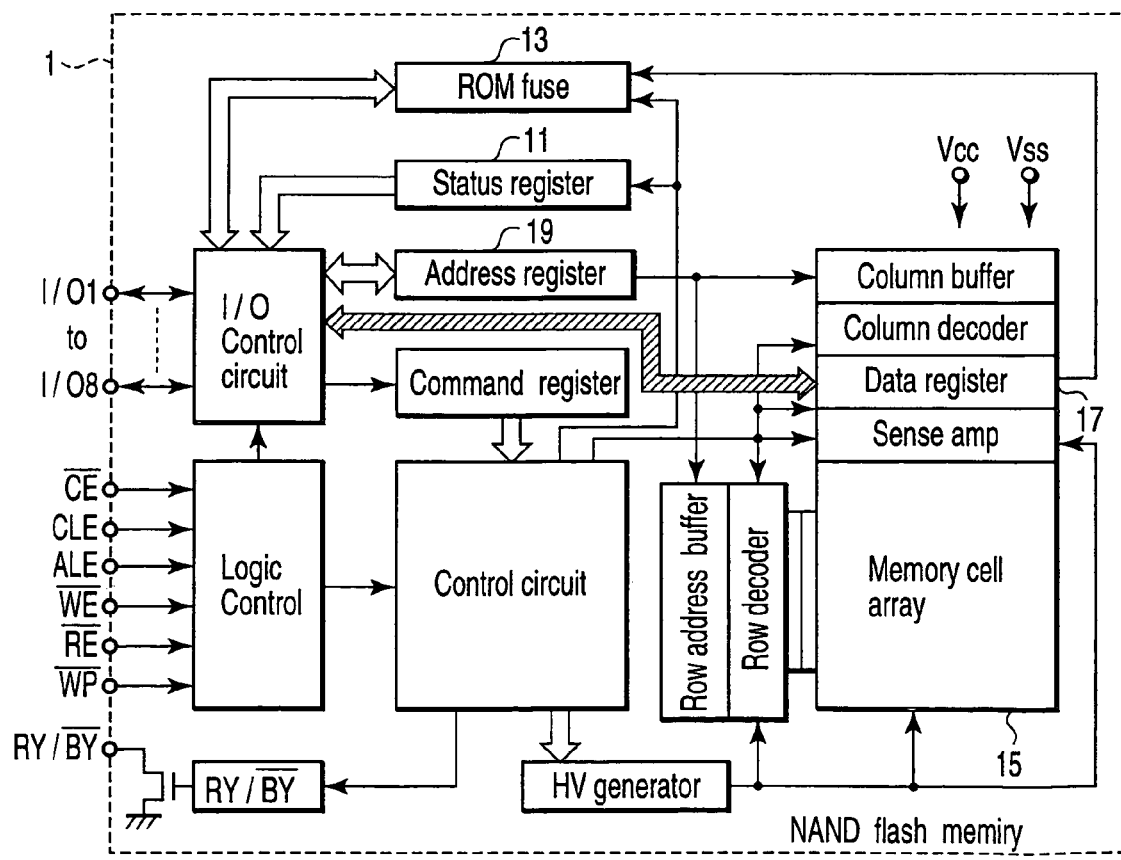
F I G. 4

NON-VOLATILE MEMORY SYSTEM HAVING A PSEUDO PASS FUNCTION

CROSS-REFERENCE TO RELATED APPLICATIONS

This application is based upon and claims the benefit of priority from prior Japanese Patent Application No. 2004-322718, filed Nov. 5, 2004, the entire contents of which are incorporated herein by reference.

BACKGROUND OF THE INVENTION

1. Field of the Invention

The present invention relates to a non-volatile memory system, and in particular, to a non-volatile memory system having a pseudo pass function.

2. Description of the Related Art

If a non-volatile semiconductor memory device, for example, NAND flash memory, is used, bit error detection and correction by error checking and correcting (ECC) are effective for ensuring sufficient reliability. For example, a standard system using a multi-value NAND flash memory has a built-in ECC, which enables four-symbol bit error detection and correction per page.

High integration and large capacity have advanced in the NAND flash memory. In a NAND flash memory having such high integration and large capacity, the following phenomenon has recently been confirmed. According to the phenomenon, the threshold value of a certain memory cell suddenly becomes high; as a result, data is not correctly written or erased. This phenomenon is called "sudden bit error" in the following description.

The address at which the foregoing sudden bit error occurs is completely random, and the cause is not related to the operational history. However, sudden bit error is possibly related to the aging degradation of a memory cell. Even if sudden bit error occurs, data is erased, and thereafter, the data is again written, and thereby, recovery is made. Judging from the peculiarity described above, sudden bit error is not a phenomenon which happens resulting from fatal failure of the memory cell, but is considered a soft error. There exists no way to effectively prevent sudden bit error at present.

Sudden bit error occurs in non-volatile semi-conductor memory devices using the same non-volatile memory cell as NAND flash memory regardless of the NAND flash memory. There is a possibility of a serious problem arising in a multi-value memory having a data corresponding threshold distribution range severer than a normal two-value memory.

In view of the foregoing circumstances, the following concept has been proposed. For example, in the multi-value NAND flash memory, it is advantageous in cost to allow sudden bit error to some degree to ensure reliability. A function developed based on the foregoing concept is a so-called the "pseudo pass function". The pseudo pass function is a method of returning a "pass" as the status even if a bit error occurs in one or two bits when a chip internal write or erase sequence is completed. For example, the foregoing method has been disclosed in U.S. Pat. No. 6,185,134 and Japan Patent Registration No. 3178912. More specifically, even if the bit error occurs when a chip internal write or erase sequence is completed, ECC is carried out in a system or flash controller in the read operation. For this reason, no hindrance is given so long as the bit error is within a range of the number of correctable bits.

However, if the foregoing pseudo pass function is employed, all bits must be given as correct data when a chip internal write or erase sequence is completed. For this reason, the probability of causing a bad block is readily enhanced as compared with the case where no pseudo pass function is employed. As a result, there is a problem that available memory capacity is easily reduced.

Reference documents:
U.S. Pat. No. 6,185,134
JPN. Patent Registration No. 3178912

BRIEF SUMMARY OF THE INVENTION

According to one aspect of the present invention, there is provided a non-volatile memory system comprising:
a non-volatile memory; and
a memory controller controlling the non-volatile memory,
the non-volatile memory having a pseudo pass function of returning a pass as a status even if a bit error reaching a allowable number of bits occurs after at least one of a write or erase sequence is completed,
the memory controller having an allowable bit change function of changing the upper limit value of the allowable number of bits.

BRIEF DESCRIPTION OF THE SEVERAL VIEWS OF THE DRAWING

FIG. 1 is a circuit diagram showing the configuration of a pseudo pass-enabled data register;

FIG. 3 is a block diagram showing the configuration of a non-volatile memory system according to a first embodiment of the present invention;

FIG. 4 is a block diagram showing the configuration of one block of a non-volatile memory used for the non-volatile memory system according to the first embodiment of the present invention;

DETAILED DESCRIPTION OF THE INVENTION

Figure 2:
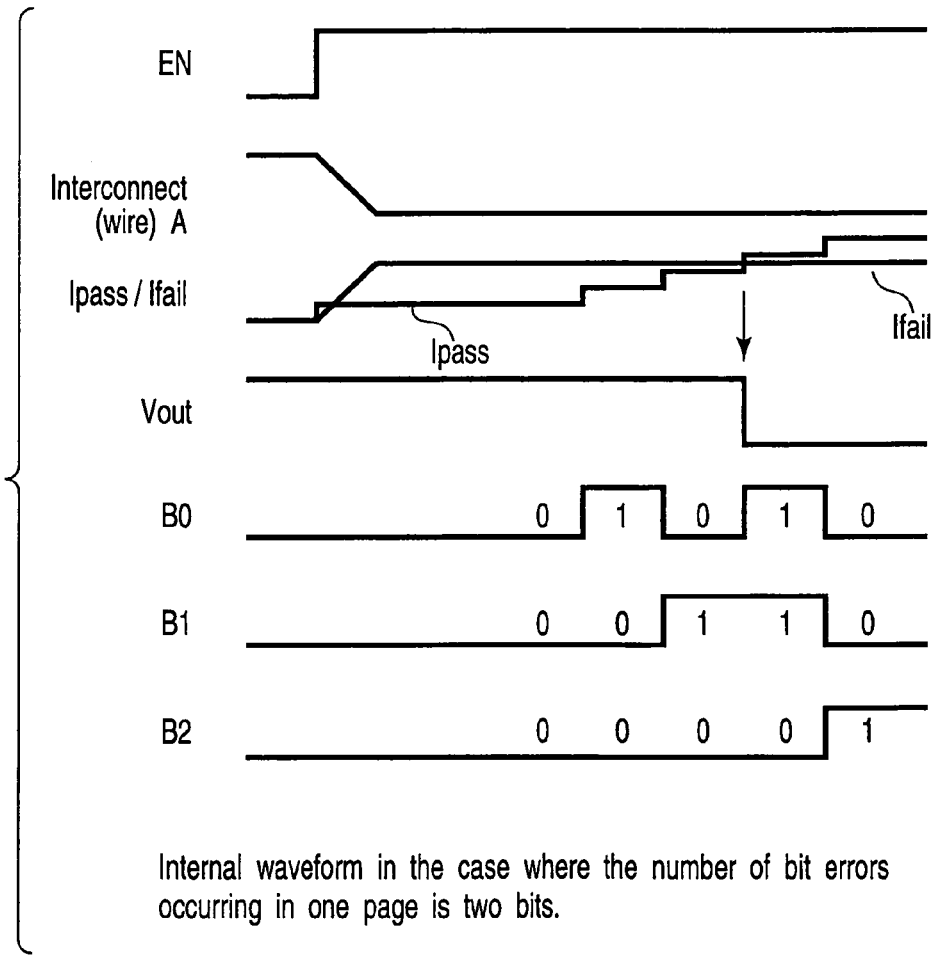
FIG. 2 is a waveform chart showing internal waveforms of the pseudo pass-enabled data register.

Embodiments of the present invention will be described below with reference to the accompanying drawings. In the following description, the same reference numerals are used to designate identical portions over all drawings.

First Embodiment

In a non-volatile memory, for example, a NAND flash memory, the state of a memory cell is automatically verified in the chip during a chip internal write or erase sequence. The following is an explanation of the case where the chip internal write sequence is carried out. The chip internal erase sequence is carried out in the same manner as above.

The write operation is carried out using a page as the unit. Each bit line is connected with a data register, and data equivalent to one page is loaded into the data register at the beginning of the write operation. The write is divided several times, and then, the state of the memory cell is verified together with data included in the data register. The chip internal write sequence ends in the following cases. One is the case where it is confirmed according to the verify operation that a write to all memory cells of the page is completed. Another is the case where the write time exceeds a predetermined time. Another is the case where the write verify cycle exceeds the predetermined number of cycles.

The chip internal write sequence ends, and thereafter, the verify result is held as an internal status of the NAND flash memory. The status is read outside by inputting a status read command.

The status read is carried out for the purpose of detecting a fatal fault of memory cell. For this reason, a block including a page outputting "fail" as the status is registered as a bad block, and then, the bad block is not used after that. The memory cell makes a charge exchange via a thin tunnel oxide film; for this reason, data rewrite is repeated, and thereby, is degraded; as a result, a fatal fault occurs in the memory cell. The reason why the block registered as the bad block is not used is because the memory cell having the fatal fault does not only store data, but also has a possibility of giving an influence to other memory cells. In the conventional case, if one bit is detected as the bit error when the chip internal write or erase sequence is completed, "fail" is returned as the status. As described in the foregoing "the Related Art", an advanced NAND flash memory having high integration and large capacity, that is, a non-volatile memory having a possibility that sudden bit error occurs, is disadvantageous in its cost. In view of the circumstances described above, the NAND flash memory of the first embodiment has a pseudo pass function. For example, a multi-value NAND flash memory is configured on the presumption of four-bit correction ECC recommended when using the foregoing pseudo pass function. The allowable number of bits allowed as the pseudo pass is set to one or two bits.

In the normal read operation, the presumption is given such that error checking and correcting (ECC) is used, and if bit error exists, the bit error is corrected. Thus, the bit error occurring in the normal read operation is not reflected as the status. If the bit error occurring in the normal read operation is reflected as the status, bad blocks merely increase needlessly.

FIG. 1 shows the configuration of a pseudo pass-enabled data register used for a NAND flash memory having a pseudo pass function.

The pseudo pass-enabled data register has a register (page buffer) 100 storing data equivalent to one page. The data register makes a wired OR connection for one byte in order to collectively detect the verify result, and inputs it to each page of PMOS included in a SD circuit. The PMOS of the SD circuit carries a current Ifail proportional to the number of bits if a bit having incomplete write exists in the page buffer. The current Ifail is compared with a current Ipass of circuits SDP_0, SDP_1, SDP_2 and SDP_3, and thereby, it is possible to detect the number of bits having incomplete verify. The circuit SDP_0 is a system for making a detection that write of all bits included in the page is completed. In this case, the gate width of a PMOS1 included in the circuit SDP_0 is set to a half of each PMOS2 included in circuits SDP_1 to circuit SDP_3. Thus, it is possible to securely detect that a write is completed without depending on variations of transistor.

In FIG. 2, there are shown internal waveforms when the data register shown in FIG. 1 detects the number of allowed bits. FIG. 2 shows internal waveforms of the data register in the case where bit error occurring in one page is two bits.

Conventionally, the allowable number of bits allowed as the pseudo pass has been set in delivery; therefore, user can not change it during user's handling. However, the occurrence probability of bit error has a tendency to increase resulting from the reason why the sudden bit error occurs in user's handling and memory cell is degraded. If the allowable number of bits set in delivery is used, bad block gradually increases needlessly. On the contrary, if the allowable number of bits is set higher in view of the case where the bit error increases during the use, the following problem arises. More specifically, time spent for ECC in the read operation becomes longer than the initial use. As a result, the performance of the system using the NAND flash memory is reduced from the initial use.

In order to solve the problem, according to the first embodiment, the upper limit value of the allowable number of bits allowed as the pseudo pass is changed even if the user is handling. The function of changing the allowable number of bits according to the embodiment will be described below. In this case, a non-volatile memory system controlling a non-volatile memory using a memory controller is given as one example.

FIG. 3 is a block diagram showing the configuration of a non-volatile memory system according to a first embodiment of the present invention. In this embodiment, a NAND flash memory is used as a non-volatile memory, and a flash controller is used as the memory controller.

As shown in FIG. 3, a flash controller 3 controls a NAND flash memory 1. For example, the controller 3 makes access to the memory 1 according to a request from an external host, and controls data read, data write and data erase. The memory 1 has a control pin and input/output pin. The control pin is basically used for receiving control signals from the controller 3. The input/output pin is basically used for making a data exchange with the controller 3, receiving commands from the controller 3 and transmitting status to the controller 3. In the first embodiment, /CE (chip enable), ALE (address latch enable), CLE (command latch enable) /WE (write enable), /RE (read enable), RY/BY (ready/busy) and /WP (write protect) are given as the control pin. I/O1 to I/O8 are given as the input/output pin. The foregoing control pin and input/output pin are connected to the controller 3.

FIG. 4 shows the configuration of one block of the memory 1. The block shown in FIG. 4 will be described below together with the operation of the block. A write sequence will be described below as one example of the operation; in this case, erase sequence is built up in the same manner as the write sequence. In other words, the sequence is built up in write or erase sequence so long as the controller 3 includes a change processing sequence of changing the upper limit value of the allowable number of bits. Thus, the controller 3 is provided with an allowable bit number change processing section for executing the change processing sequence. The allowable bit number change processing section may be a central processing unit included in the controller 3. For example, a logic circuit may be used, or the change processing section may be provided separately from the logic circuit. In the former case, software programming the change processing sequence is programmed in ROM or rewritable ROM of the controller 3, and the logic circuit of the controller 3 is controlled according the program. In the latter case, an integrated circuit for executing the change processing sequence is formed in a chip of the controller 3.

The memory further includes an allowable bit number holding section for holding the allowable number of bits. The allowable bit number holding section may be configured rewritably according to the control by the controller 3 so that it is adaptable to a change of the allowable number of bits.

Figure 5:
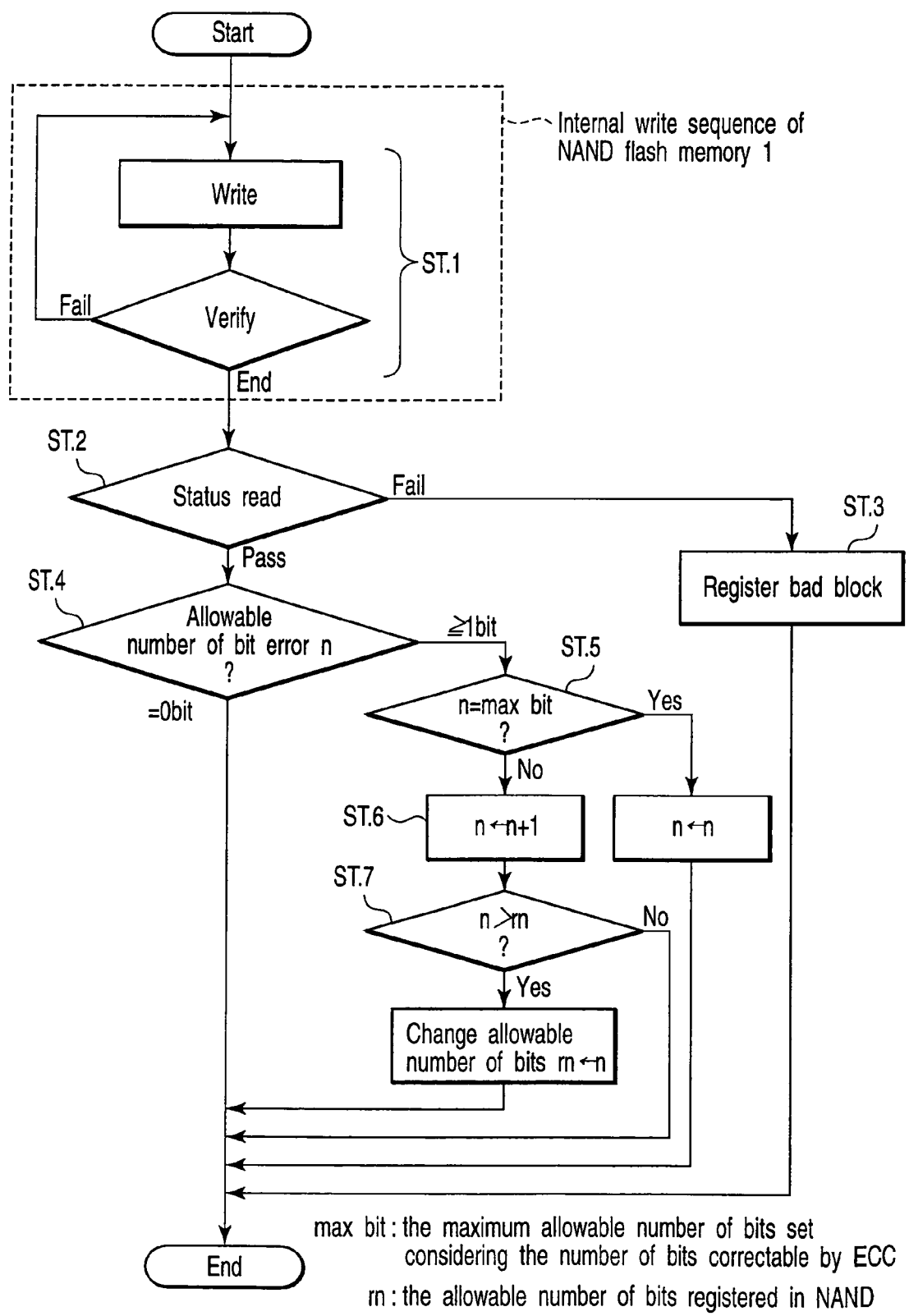
FIG. 5 is a flowchart to explain a write sequence of the non-volatile memory system according to the first embodiment of the present invention.

FIG. 5 is a flowchart to explain the write sequence of the non-volatile memory system according to the first embodiment of the present invention.

As depicted in FIG. 5, the controller 3 issues a write command according to a request from the system. When receiving the write command, the memory 1 automatically repeats a write verify sequence (ST. 1)

After the chip internal write sequence ends (End), for example, the voltage (potential) of the RY/BY pin changes from level "L" to level "H". In other words, a notification that the memory 1 returns from the Busy state to the Ready state is given to the controller 3. The controller 3 confirms that the memory 1 returns to Ready state, and thereafter, issues a status read command. When receiving the status command, the memory 1 outputs a status of write to the corresponding block held in a status register 11 (ST. 2).

Figure 6:
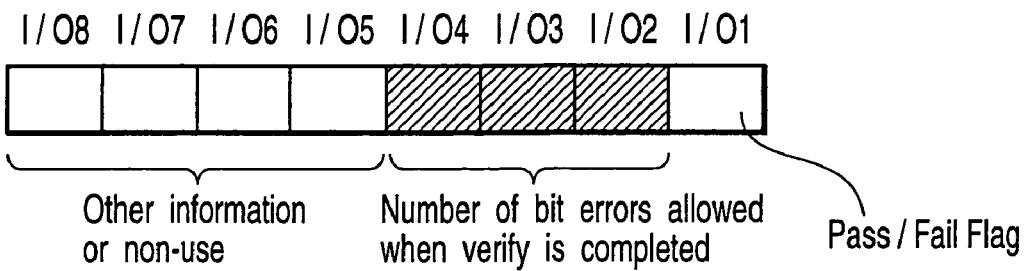
FIG. 6 is a view to explain a status output.

FIG. 6 shows a status output from the memory 1. The status is outputted from an I/O port of the memory 1, that is, input/output pins I/O1 to I/O8. The least significant bit I/O1 represents "pass" or "fail" of the status. For example, if the output value of the I/O1 is "0", "pass" is given; on the other hand, if it is "1", "fail" status is given.

If the status is "fail" (Fail), the corresponding block is registered as a bad block (ST. 3), and thereafter, the write sequence of the system ends. The block registered as the bad block is not used.

If the status is "pass" (Pass), reference is made with respect to the number of bit errors n allowed as the pseudo pass when verify is completed. FIG. 6 shows an output example of the number of bit errors n. As seen from FIG. 6, the number of bit errors n is outputted to I/O2 to I/O4 as a binary. The method of outputting the number of bit errors n is not limited to the example shown in FIG. 6; in this case, bit assign may be changed. In addition, a command different from the status read command, for example, command for reading the number of bit errors n is newly set, and then, the number of bit errors n may be output according to the command.

In step ST. 4, if the number of bit errors n is 0 bit (=0 bit), it is unnecessary to take procedures any more; therefore, the write sequence of the system ends.

On the other hand, if the number of bit errors n is 0 bit ($\geq 1$ bit), the flow transfers to a change processing sequence for changing the allowable number of bits rn stored in the memory 1.

The memory 1 of the first embodiment stores the allowable number of bits rn in a ROM fuse 13. The ROM fuse 13 is formed of memory cells having the same structure as the memory cells included in a memory cell array 15. The ROM fuse 13 may be formed in an area different from the memory cell array 15 as described in the first embodiment, or may be formed in part of the memory cell array 15.

The number of bit errors n is compared with the maximum allowable number of bits (Max bit) (ST. 4). The maximum allowable number of bits is set considering the maximum number of bits correctable by an ECC circuit provided in the controller 3 or system. For example, if the ECC circuit has four-bit error detecting and correcting performance, the maximum allowable number of bits is set to less than four bits.

In step ST. 5, if the number of bit errors reaches the maximum allowable number of bits (Max bit) (Yes), there is no need of changing the allowable number of bits rn. Thus, the write sequence of the system ends.

On the other hand, if the number of bit errors is less than the maximum allowable number of bits (Max bit) (No), for example, "plus 1" is added to the number of bit errors n (ST. 6). Then, the number of bit errors n to which "plus 1" is added is compared with the allowable number of bits rn (ST. 7).

In step ST. 7, if the number of bit errors n to which "plus 1" is added is less than the allowable number of bits rn (No), there is no need of changing the allowable number of bits rn. Thus, the write sequence of the system ends.

On the other hand, if the number of bit errors n to which "plus 1" is added is more than the allowable number of bits rn (Yes), the allowable number of bits rn is changed into the number of bit errors n to which "plus 1" is added. The changed allowable number of bits rn is written in the ROM fuse 13 to update the allowable number of bits rn stored in the ROM fuse 13, and thereafter, the updated number is again held therein.

In order to write the changed allowable number of bits rn in the ROM fuse 13, a new write command for addressing the ROM fuse 13 is set, and then, write is carried out according to the new write command. This is because the ROM fuse 13 is addressed, and thereby, data of the ROM fuse 13 is rewritable in the same manner as normal memory cells. Because, the operation information of the memory 1, for example, redundancy information is written in the ROM fuse 13. For this reason, the memory 1 has a test mode command for writing the operation information in the ROM fuse 13 and correcting it. Therefore, the ROM fuse 13 is rewritable in the same manner as normal memory cells. In the write operation, the test mode command may be used without setting a new write command.

In any case, the value of the allowable number of bits rn newly stored in the ROM fuse 13 is reflected from the next write sequence.

According to the first embodiment, the following configuration is provided. That is, the upper limit value of the allowable number of bits allowed as the pseudo pass is changed according to the instruction from the controller 3 during user handling. The foregoing configuration is provided, and thereby, it is possible to increase the upper limit value of the allowable number of bits during user handling. Therefore, this serves to solve the problem that the bad block increases needlessly during user handling.

According to the first embodiment, it is possible to provide a non-volatile memory system including a non-volatile memory, which has a pseudo pass function while preventing the reduction of available memory capacity.

Second Embodiment

Figure 7:
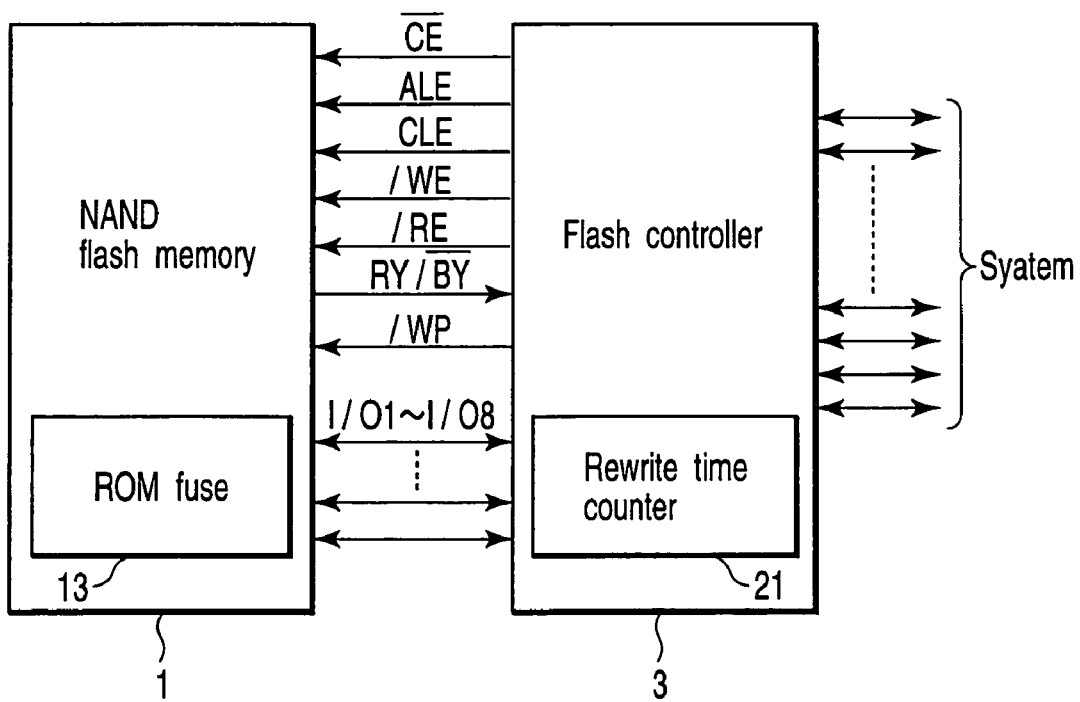
FIG. 7 is a block diagram showing the configuration of a non-volatile memory system according to a second embodiment of the present invention.

FIG. 7 is a block diagram showing the configuration of a non-volatile memory system according to a second embodiment of the present invention.

As shown in FIG. 7, a controller 3 used in the second embodiment includes a count section for counting the number of rewrite times of the memory 1. A counter is given as one example of the count section, and calls a rewrite counter 21 in this second embodiment.

In the memory cell of the memory 1, its write performance is reduced gradually with an increase of the number of data rewrite times. As a result, the probability of causing sudden bit error becomes high. Conventionally, in the memory 1 having the pseudo pass function, the same allowable number of bits is applied all over the period from the delivery to the use. Considering the entirety of the non-volatile memory system including the controller 3, a block such that several sudden bit errors occur in one page is registered as a bad block in the delivery, and then, should not used. By doing so, the performance rather improves. Thus, the allowable number of bits is set less, for example, to 1 bit.

However, when the number of rewrite times increases while sudden bit error increases, "fail" is returned as the write status regardless of the number of bit errors correctable by ECC of the controller 3 or the system. For this reason, block registered as bad block is increasing; as a result, the available memory area is reduced. According to the degradation of normal memory cell, the increased tendency of the sudden bit error to the number of rewrite times is predictable to some degree. Thus, the allowable number of bits may be changed when rewrite reaches a predetermined number of times. The method described above is effective to properly obtain both system performance and lifetime.

In the second embodiment, the allowable number of bits rn is stored in the ROM fuse 13 of the memory 1, like the first embodiment. As described in the first embodiment, the data of the ROM fuse 13 is rewritable in the same manner as normal memory cells by addressing the ROM fuse 13.

The controller 3 monitors the number of rewrite times of the memory 1, for example, the number of rewrite times of memory cell using the rewrite counter 21. The controller 3 often employs the method calling ware leveling; therefore, rewrite of the memory cell is averaged. The controller 3 changes the allowable number of bits rn set in the memory 1 if the value of the rewrite counter 21 reaches the predetermined number of times. For example, the controller 3 issues a ROM fuse rewrite command to rewrite the allowable number of bits n held in the ROM fuse 13.

Figure 8:
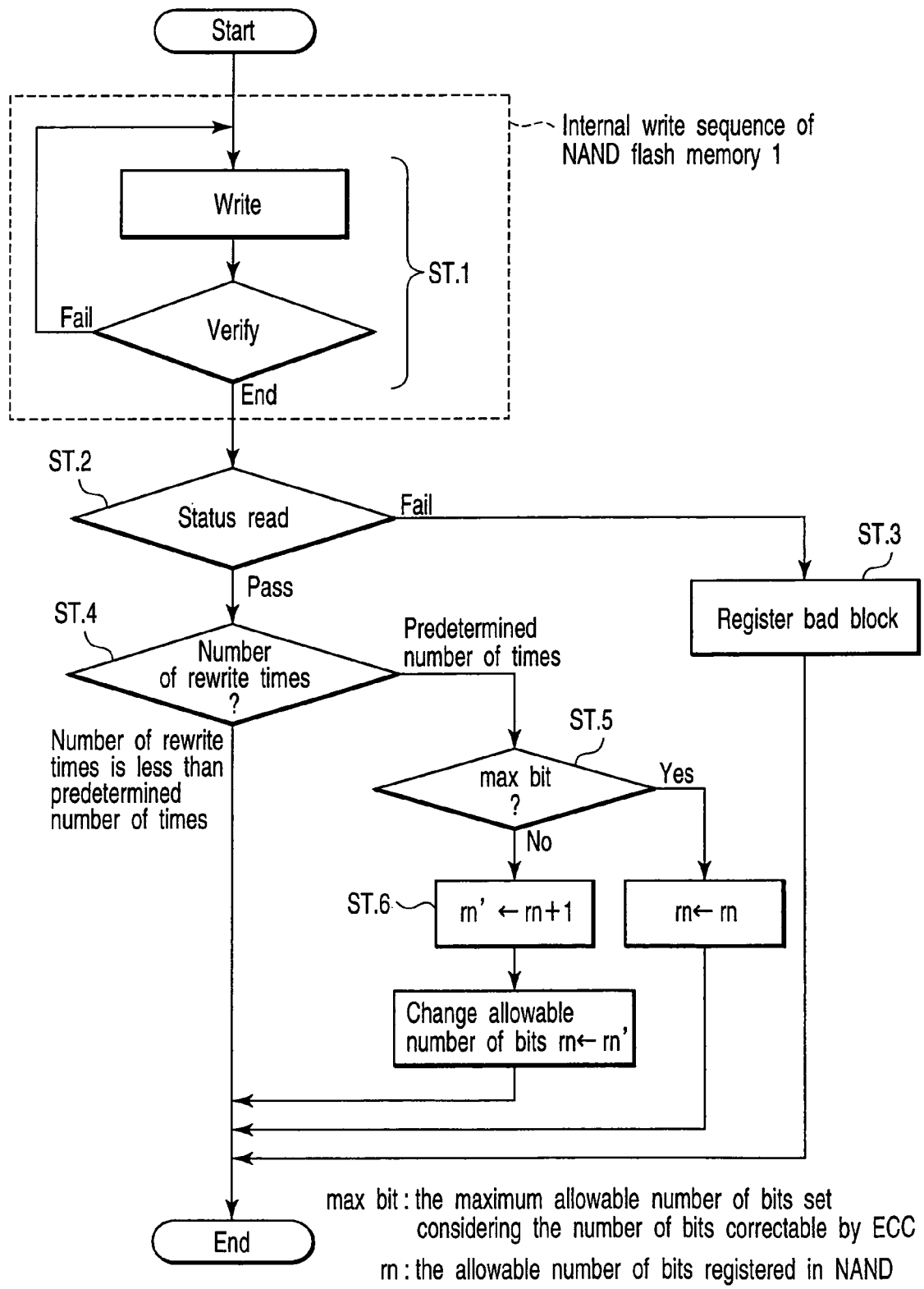
FIG. 8 is a flowchart to explain a write sequence of the non-volatile memory system according to the second embodiment of the present invention.

FIG. 8 is a flowchart to explain the write sequence of the non-volatile memory system according to the second embodiment of the present invention.

As seen from FIG. 8, the write sequence of the second embodiment is substantially the same as that described in the first embodiment except the following point. More specifically, the allowed number of bit errors n is not monitored, but the number of rewrite times is monitored in step ST. 4.

In step ST. 4, if the number of rewrite times is less than the predetermined number of times, the write sequence of the system ends.

If the number of rewrite times reaches the predetermined number of times, it is determined in step ST. 5 whether or not the allowable number of bits rn is the maximum allowable number of bits (Max bit). If the allowable number of bits rn reaches the maximum allowable number of bits (Max bit) (Yes), the write sequence of the system ends.

On the other hand, if the allowable number of bits rn does not reach the maximum allowable number of bits (Max bit) (No), "plus 1" is added to the allowable number of bits rn (ST. 6). Then, a new allowable number of bits rn' to which "plus 1" is added is changed into a new allowable number of bits rn. Thereafter, the same write sequence as described in the first embodiment is carried out.

According to the second embodiment, the same configuration as the first embodiment is provided. That is, the upper limit value of the allowable number of bits rn allowed as the pseudo pass is changed according to the instruction from the controller 3 during user handling. Therefore, the same effect as the first embodiment is obtained.

According to the second embodiment, the upper limit value of the allowable number of bits rn is changed based on the number of rewrite times of the memory cell. Therefore, the upper limit value of the allowable number of bits rn is strictly set, and thereby, the non-volatile memory system is usable with high reliability, in other words, high performance.

In aging degradation, that is, if fault memory cells increase, the upper limit value of the allowable number of bits rn is set lower. By doing so, it is possible to prevent the reduction of available memory capacity resulting from an increase of bad blocks.

Consequently, according to the second embodiment, the effects described above are further effectively obtained.

Third Embodiment

According to the foregoing embodiments, the allowable number of bits rn is stored in the ROM fuse 13. The allowable number of bits rn may be stored in forms other than the ROM fuse 13. The third embodiment relates to one example of storing the allowable number of bits rn in forms other than the ROM fuse 13.

Figure 9:
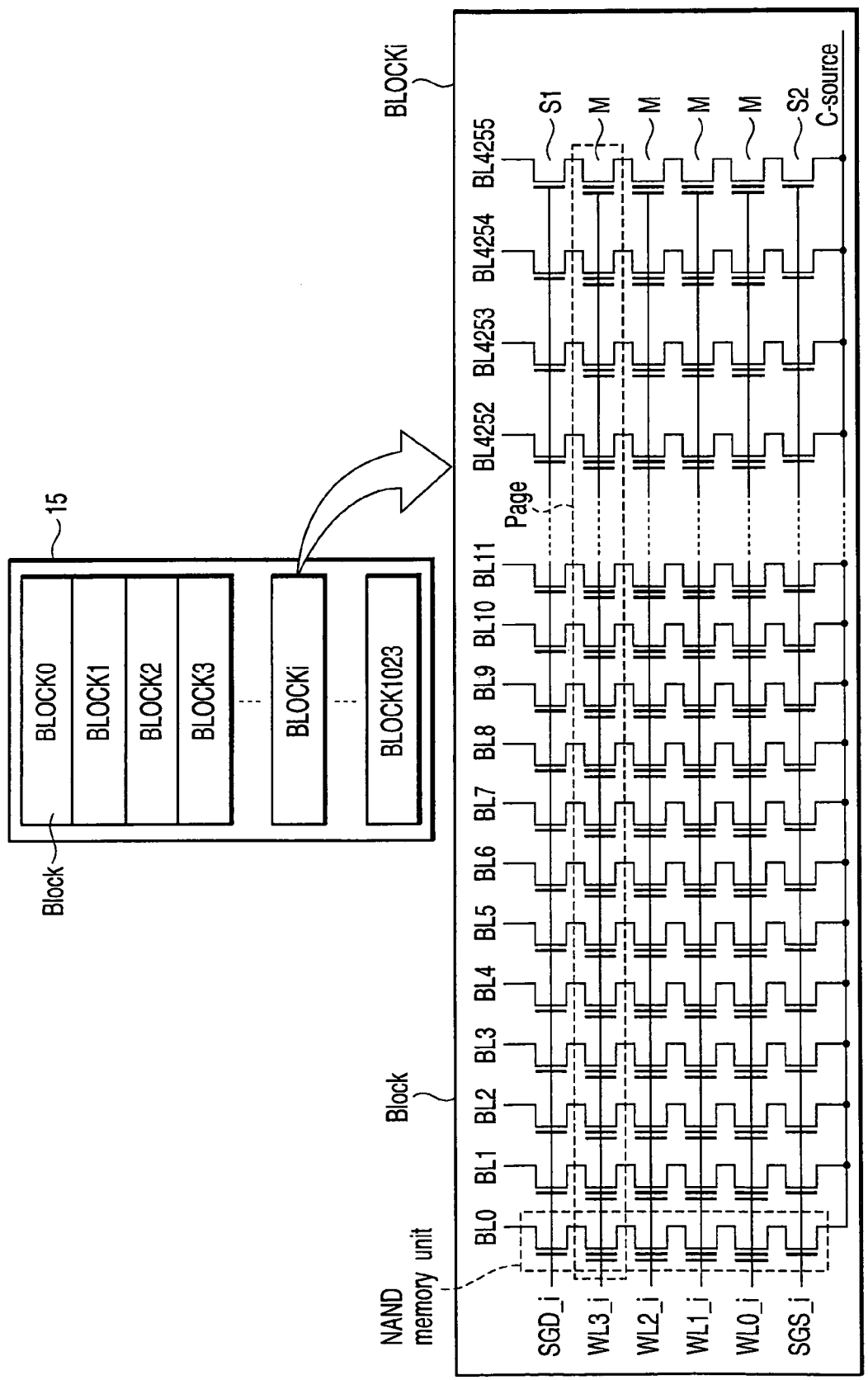
FIG. 9 is a view to explain the relationship between block and page.

According to the third embodiment, the allowable number of bits rn is stored in part of a page of a block. FIG. 9 is a view to explain the relationship between block and page.

As illustrated in FIG. 9, the memory cell array 15 includes 1024 blocks BLOCK0 to BLOCK1023. The block is used as the smallest unit for an erase. One block BLOCK includes 4256 NAND memory units. The NAND memory unit includes series-connected several non-volatile semiconductor memory cell-transistors M, for example, four memory cell transistors M. The NAND memory unit further includes a select gate transistor S1 connected to one terminal of series-connected four memory cell transistors M, and a select gate transistor S2 connected to the other terminal thereof. The gate of the select gate transistor S1 is connected to a drain select gate line SGD, and the current path is connected in series between memory cell transistors M and a bit line BL. The gate of the select gate transistor S2 is connected to a source select gate line SGS, and the current path is connected in series between memory cell transistors M and a cell source line C-source. The gates of four memory cell transistors M are connected respectively to word lines WL0 to WL3. Data write and read are concurrently carried out with respect to 4256 memory cell transistors M connected to one word line WL. Thus, one-bit data or multi-bit data stored in one memory cell transistor M is collected, and therefore, 4256 data forms a page in the third embodiment. The page is used as the smallest unit for a write and read.

Figure 10:
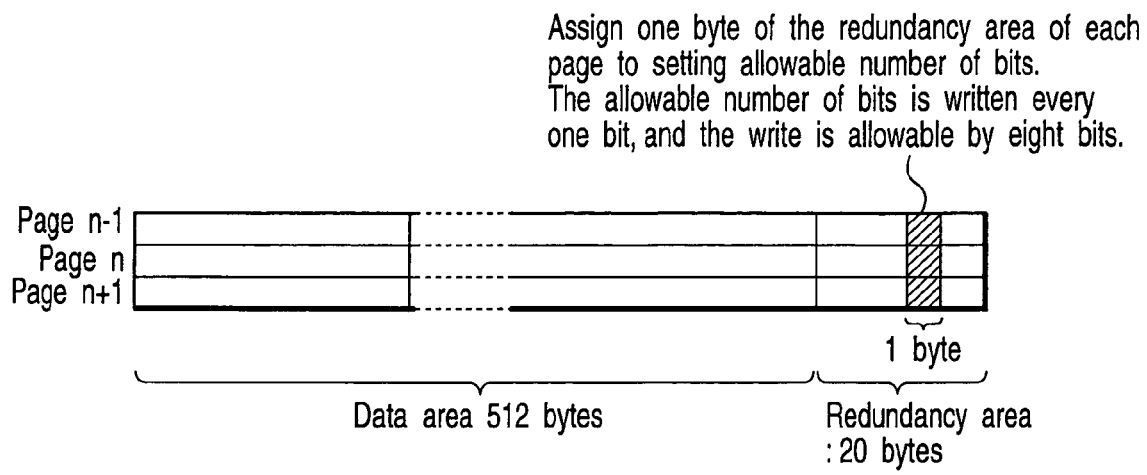
FIG. 10 is a view showing one example of a page.
Figure 11:
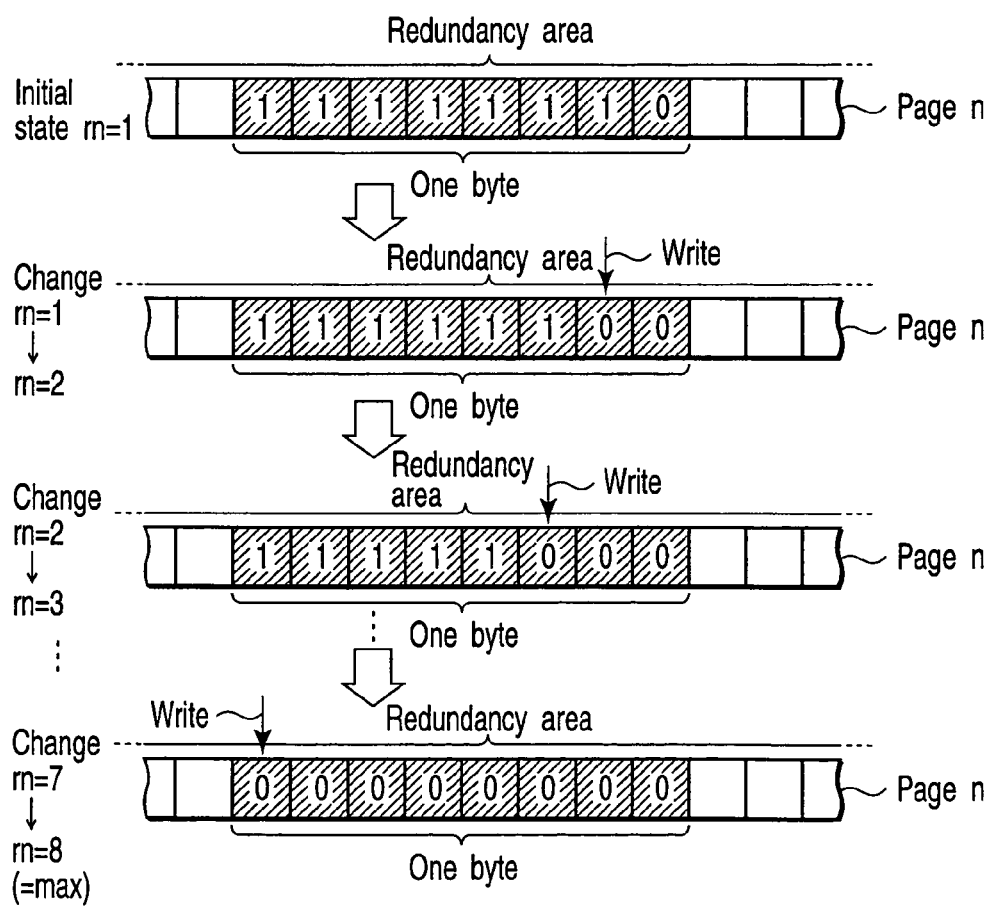
FIG. 11 is a view to explain the method of storing the allowable number of bits in part of a page.

FIG. 10 shows one example of the page. According to the third embodiment, the page size is 532 bytes, for example. In the third embodiment, 532 bytes are allocated in a manner that 512 bytes are allocated to a data area, and the remaining 20 bytes are allocated to a redundancy area. The data area is used as main memory storage used by the system, and the redundancy area is used as storage for redundancy and other information. According to the third embodiment, the allowable number of bits rn is stored using a partial area of the page, for example, part of memory cell transistors M of the redundancy area. An area storing the allowable number of bits rn is a part of the 20-byte redundancy area, for example, one byte. Some have been proposed as the method of writing the allowable number of bits rn in one byte area; in this case, one example is shown in FIG. 11. Incidentally, the explanation about the operation of writing the allowable number of bits rn will be described later.

The allowable number of bits rn is also stored in the memory cell array 15. In this case, the allowable number of bits rn may be stored in the memory cell array 15 using several, for example, one of 1024 blocks. As described in this embodiment, the allowable number of bits rn may be stored using part of each page of the block. In particular, the allowable number of bits rn is stored in part of each page of the memory cell array 15, and thereby, it is set for each page. Therefore, more precise control is possible in accordance with each page characteristic.

Figure 12:
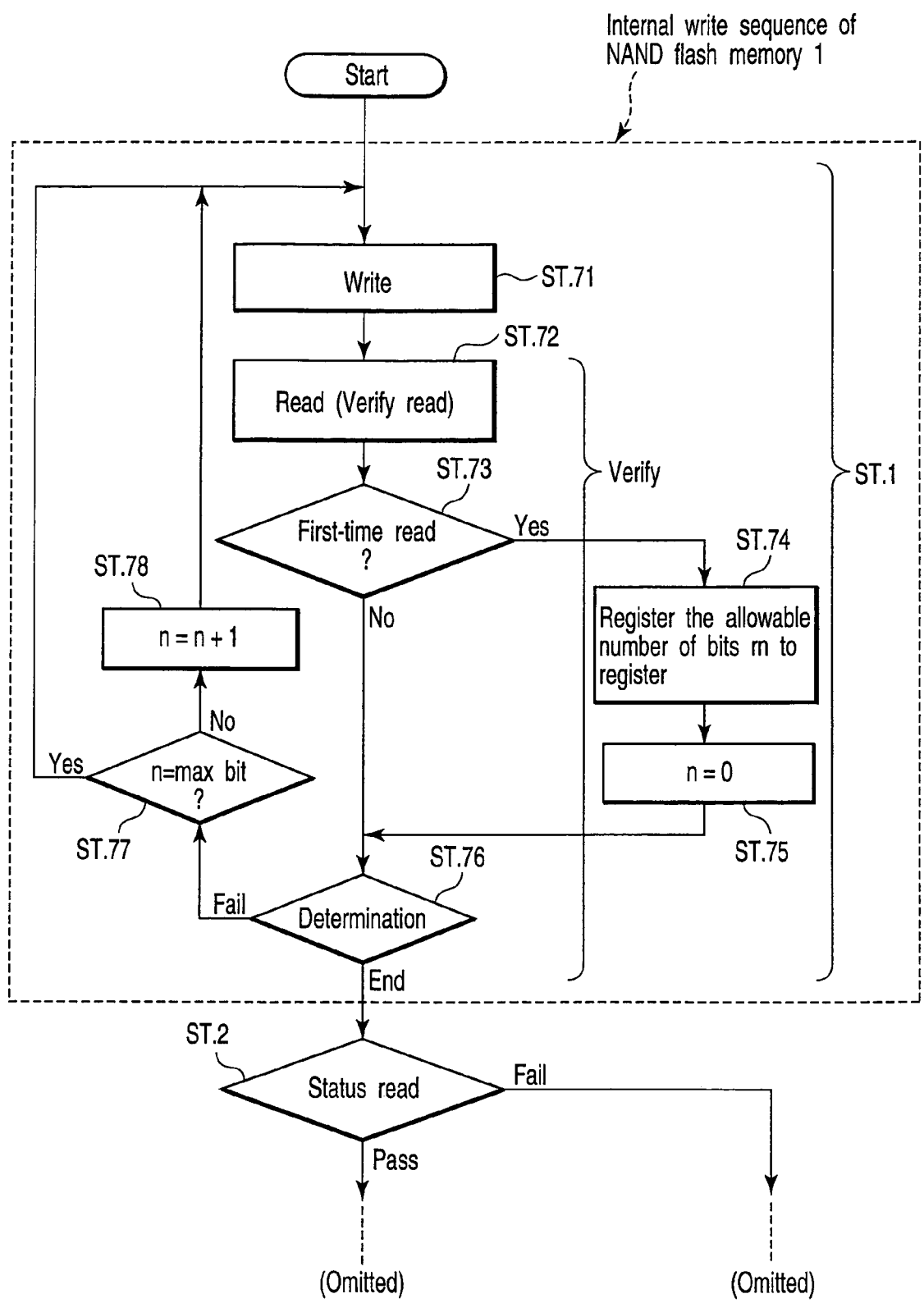
FIG. 12 is a flowchart to explain a write sequence of a non-volatile memory system according to a third embodiment of the present invention.

FIG. 12 is a flowchart to explain the write sequence of the non-volatile memory system according to the third embodiment of the present invention.

In the third embodiment, the allowable number of bits rn is set to one bit in delivery (initial state).

According to the third embodiment, in the first-time verify read after write starts, one byte data set in the redundancy area, that is, the allowable number of bits rn is read. The read allowable number of bits rn is temporarily held in a temporary register provided in the memory 1. Thereafter, the write verify operation is repeated. In each verify, the verify result is collectively detected while increasing the allowable number of bit errors n from "0" bit to the maximum bit (e.g., four bits).

In the third embodiment, the operation described above is carried out as shown in ST. 1 of FIG. 12.

In step ST. 71, write data latched in the data register 17 shown in FIG. 2 is written in a page selected by address latched in the address register 19. In step ST. 72, the write data is read from the memory cell (verify read). In step ST. 73, it is determined whether or not this read is first-time read. If the read is a first-time read (Yes), the allowable number of bits rn stored in part of the redundancy area is read, and thereafter, stored in the temporary register (ST. 74). The allowable number of bits rn is set to the initial value, that is, "0" in this embodiment (ST. 75). Thereafter, it is determined whether or not data read in the verify read coincides with the write data latched in the data register 17. Whether or not write succeeds is determined based on the allowable number of bit errors n=0 (ST. 76). If the write succeeds, the internal write sequence ends.

If the write fails (Fail), the flow transfers to a rewrite sequence. According to the rewrite sequence, it is determined whether or not the allowable number of bits n is the maximum value (max bit) (ST. 77). If the allowable number of bits n is not the maximum value (No), "plus 1" is added to the allowable number of bits n (ST. 78). Thereafter, the write operation of step ST. 71 and the verify operation of ST. 72 and ST. 76 are again carried out. When the rewrite sequence is made, it is determined in step ST. 73 that the read is not the first-time read (No). Thus, the flow transfers to determination of ST. 76 after the verify read of step ST. 73 is carried out. Thereafter, the NAND flash memory 1 automatically repeats write-verify sequence until write is completed, like the step ST. 1 of the first embodiment.

In the third embodiment, when it is determined in step ST. 76 that the write has failed (Fail), the allowable number of bits n is increased. However, there is no need to increase the allowable number of bits n every time, and the allowable number of bits n may be increased every predetermined number of times.

In step ST. 73, the allowable number of bits rn is read in the first-time read. In this case, the allowable number of bits rn may be read together with write data written in the data area of the page, or may be read separately from the write data.

After the write ends (End), the flow transfers to status read of step ST. 2. Thereafter, the same write operation as described in the first and second embodiments is carried out.

When the allowable number of bits rn is written in the page, data "0" or "1" may be added for each bit. In this case, the allowable number of bits rn is shown by the number of either data "0" or "1" in one byte of an allowable number storage section, that is, the redundancy area in this embodiment.

For example, according to FIG. 11, data "0" is added, and thereby, the allowable number of bits rn is changed. Thus, no erase operation is required when changing the allowable number of bits rn.

In the third embodiment, when changing the allowable number of bits rn, the allowable number of bits rn to be changed is set to the data register connected to the memory cell of the redundancy area. The value set in the data register is written in the memory cell of the redundancy area. In this case, there is no need of carrying out precise threshold control required for the memory cell of the main body; therefore, the rewrite operation is achieved in a relatively short time. Thus, it is possible to continuously carry out the rewrite operation in a write busy time.

APPLICATION EXAMPLE

Electronic appliances using the non-volatile memory system according to the present invention will be described below.

Figure 13:
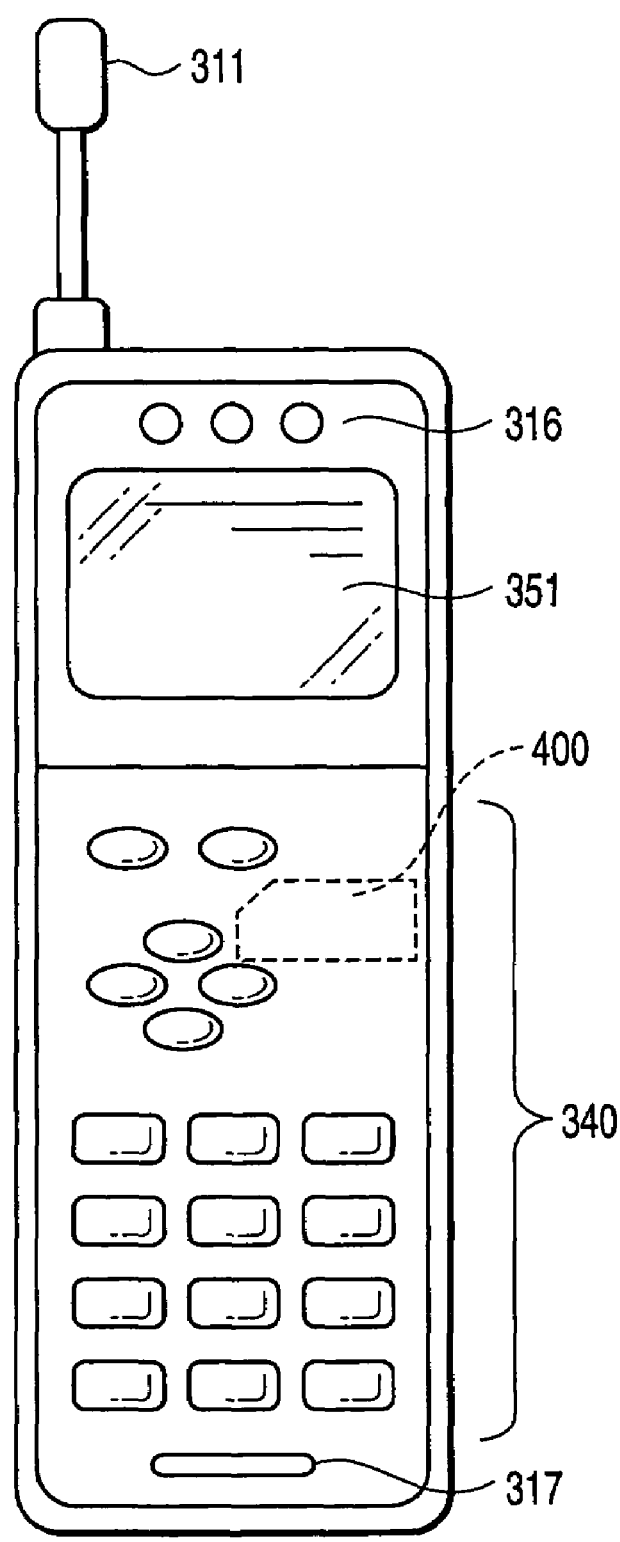
FIG. 13 is a view showing an electronic appliance using the non-volatile memory system according to the embodiments of the present invention.

FIG. 13 shows one example of electronic appliances using the non-volatile memory system according to the present invention. In FIG. 13, there is shown a portable electronic appliance, for example, a mobile phone as one example of electronic appliances.

The foregoing embodiments relate to the non-volatile memory system; for example, the non-volatile memory system is applicable to a rewritable ROM (EEPROM) of a mobile phone. Of course, the non-volatile memory system is applicable to a ROM of the mobile phone, in addition to the EEPROM.

Figure 14:
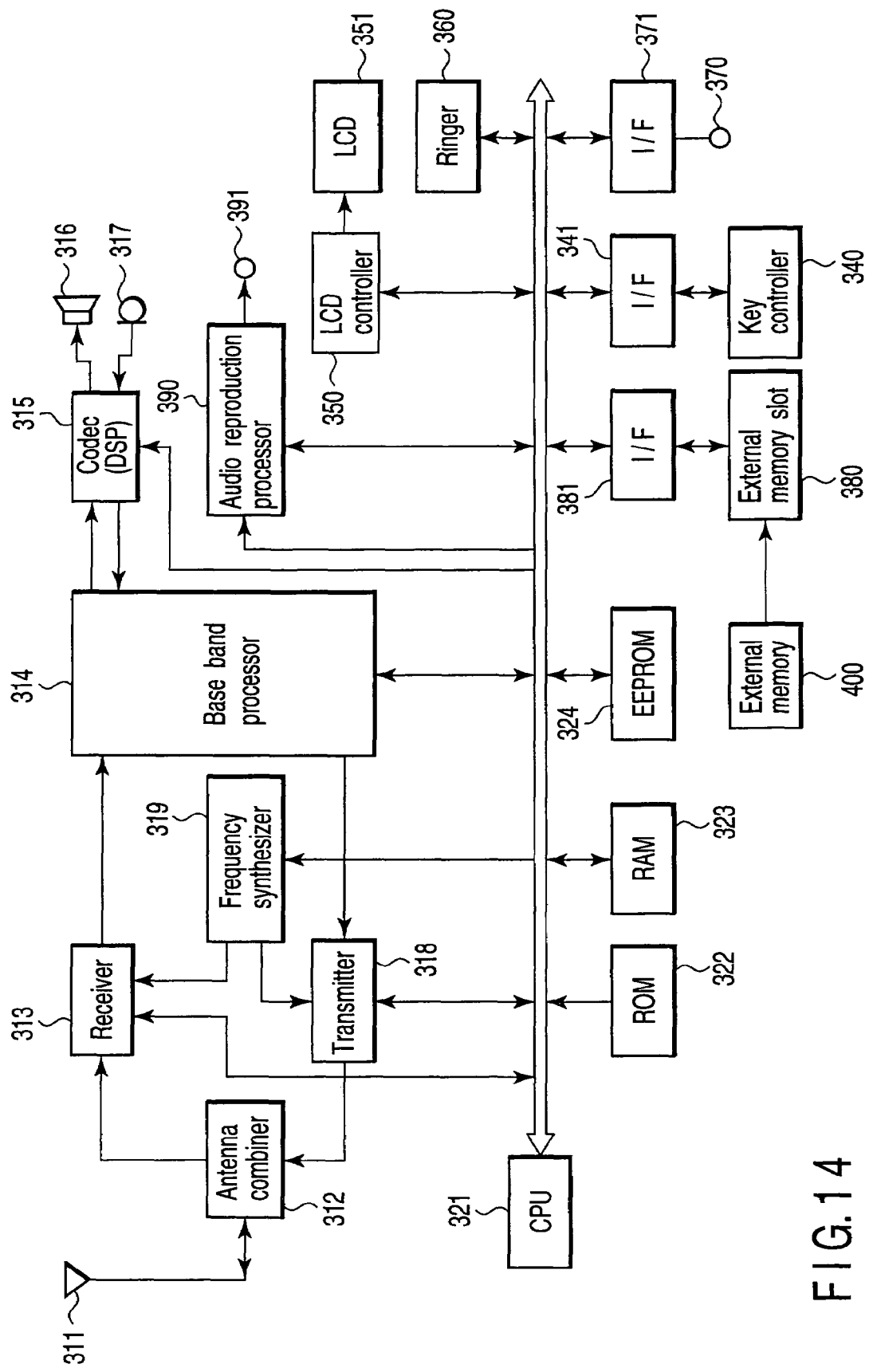
FIG. 14 is a block diagram showing the system configuration of a mobile phone.

FIG. 14 is a block diagram showing the system configuration of the mobile phone. The mobile phone will be explained below with reference to the system configuration.

As shown in FIG. 13 and FIG. 14, the mobile phone includes communication section and control section. The communication section includes a transmitting/receiving antenna 311, antenna combiner 312, receiver 313 and baseband processor 314. The communication section further includes a digital signal processor (DSP) 315 used as a voice codec, speaker 316, microphone 317, transmitter 318 and frequency synthesizer 319.

The control section includes a CPU 321, ROM 322, RAM 323 and EEPROM 324, which are connected to the CPU 321 via a CPU bus 330. The ROM 322 stores programs executed by the CPU 321, for example, necessary data such as communication protocol and display font. The RAM 323 is mainly used as a work area. For example, the RAM 323 stores calculating data in executing programs by the CPU 321 as the need arises, or temporarily stores data exchanged between the control section and sections other than there. The rewritable ROM (EEPROM) 324 is a non-volatile memory system, and data stored therein is not lost even if the mobile phone is powered off. Thus, if user takes the way to store preceding setting conditions and to make the same setting in the next power-on, the EEPROM 324 stores parameters for the foregoing setting. The non-volatile memory system of the foregoing embodiments is applicable to the EEPROM 324. Of course, the non-volatile memory system is applicable to the ROM 322.

The mobile phone further includes a key controller 340, LCD controller 350, ringer 360, external input/output terminal 370, external memory slot 380 and audio reproduction processor 390.

The key controller 340 is connected to the CPU bus 330 via an interface circuit (I/F) 341. Key input information inputted from the key controller 340 is given to the CPU 321.

The LCD controller 350 receives display information from the CPU 321 via the CPU bus 330, and converts it into LCD control information for controlling a liquid crystal display (LCD) 351, and thereafter, gives it to the LCD 351.

The ringer 360 generates a ring tone.

The external input/output terminal 370 is connected to the CPU bus 330 via an interface circuit 371. The external input/output terminal 370 functions as a terminal of inputting information to the mobile phone from outside and outputting it to the outside from the mobile phone.

An external memory 400 such as memory card is inserted into the external memory slot 380. The external memory slot 380 is connected to the CPU bus 330 via an interface circuit 381. The mobile phone is provided with the slot 380, and thereby, the following function is obtained. In brief, information from the mobile phone is written in the external memory, and information stored in the external memory 400 is read, and thereafter, inputted to the mobile phone.

The external memory 400 is a memory card, for example. The memory card has a non-volatile memory system as storage section. The non-volatile memory system of the foregoing embodiments is usable as the storage section of the memory card.

The audio reproduction processor 390 reproduces audio information inputted to the mobile phone or audio information stored in the external memory 400. The reproduced audio information is given to a headphone and portable speaker via an external terminal 391, and thereby, fetched outside. For example, the mobile phone is provided with the audio reproduction processor 390, and thereby, audio information is reproducible.

As is evident from the foregoing description, the non-volatile memory system of the present invention is applicable to mobile phone and memory card.

Figure 15A:
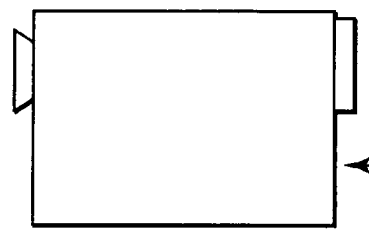
FIGS. 15A to 15F are views showing electronic appliances loaded with a memory card using the non-volatile memory system according to the embodiments of the present invention.
Figure 15B:
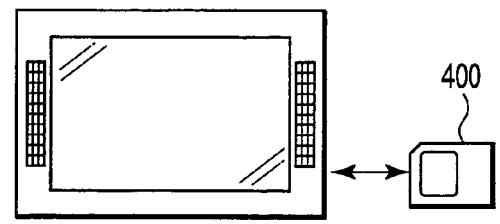
Figure 15C:
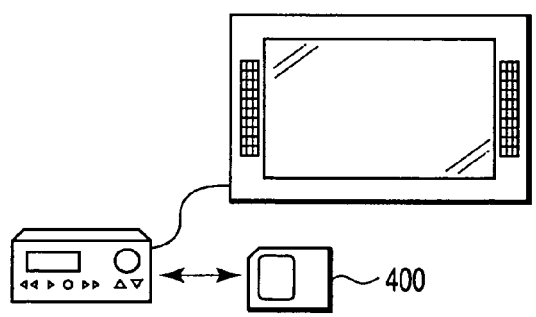
Figure 15D:
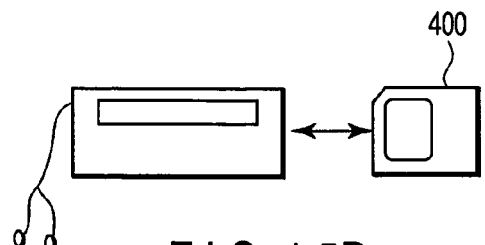
Figure 15E:
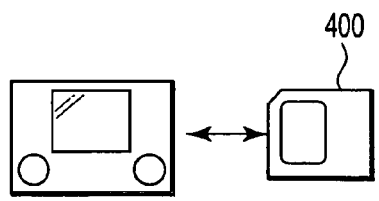
Figure 15F:
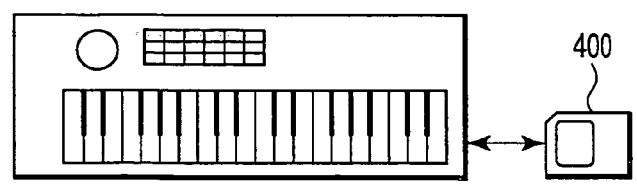
Figure 16A:
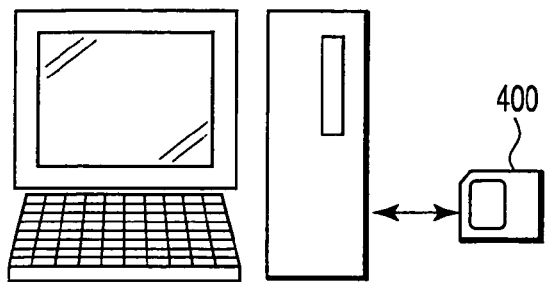
FIGS. 16A to 16E are views showing electronic appliances loaded with a memory card using the non-volatile memory system according to the embodiments invention.
Figure 16B:
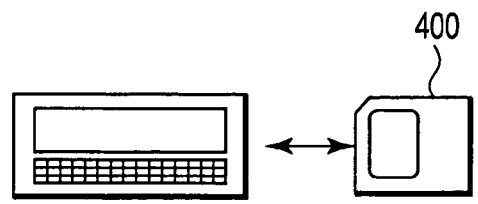
Figure 16C:
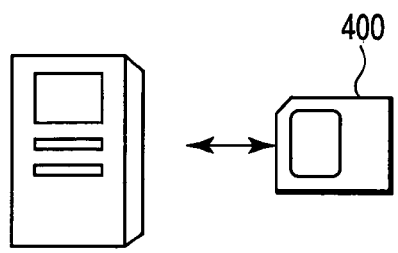
Figure 16D:
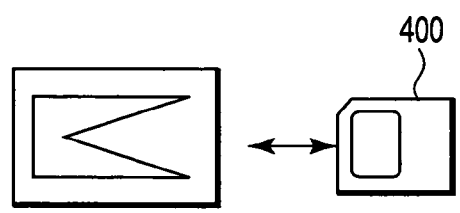
Figure 16E:
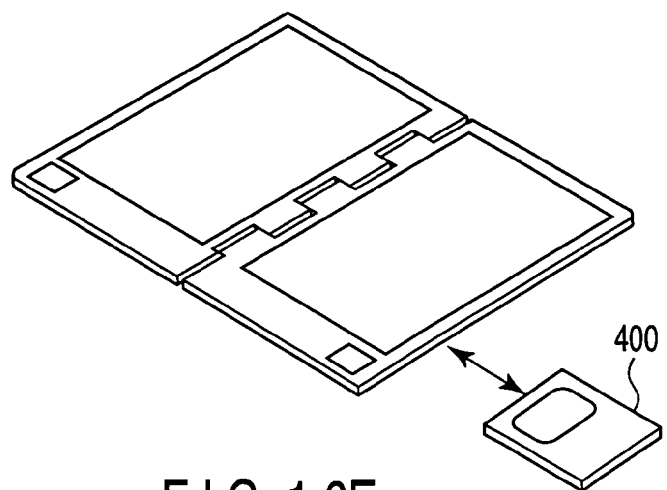

The memory card 400 using the non-volatile memory system of the present invention is applicable as recording media of electronic appliances shown in FIGS. 15A to 15F and FIGS. 16A to 16E. The electronic appliances include a digital still camera/video camera (FIG. 15A), television (FIG. 15B), audio/visual apparatus (FIG. 15C), audio apparatus (FIG. 15D), game machine (FIG. 15E) and electronic musical instrument (FIG. 15F). The electronic appliances further include a personal computer (FIG. 16A), personal digital assistant (PDA) (FIG. 16B), voice recorder (FIG. 16C), PC card (FIG. 16D) and electronic book terminal (FIG. 16E).

The present invention has been described using several embodiments; in this case, the present invention is not limited to these embodiments. Various modifications may be made without diverging from the subject matter of the invention.

For example, the upper limit value of the allowable number of bits rn may be changed every block of the memory 1 or every page thereof.

A binary memory or multi-value memory may be given as the memory 1. The NAND flash memory is given as one example of the memory 1; in this case, the memory 1 is not limited to the NAND flash memory.

The foregoing embodiments are solely carried out; in this case, these embodiments may be carried out in combination with each other.

The foregoing embodiments each include various inventive steps, and several constituent requirements shown in each embodiment are properly combined, and thereby, various inventive steps are extracted.

The foregoing embodiments have explained about the example in which the present invention is applied to a non-volatile memory system. The present invention is not limited to the non-volatile memory system. In this case, the present invention is applicable to semiconductor integrated circuit devices including the non-volatile memory system, for example, a processor and system LSI. In addition, the present invention is applicable to an electronic appliance system using including the non-volatile memory system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile memory system comprising: a non-volatile memory; and a memory controller controlling the non-volatile memory, the non-volatile memory having a pseudo pass function of returning a pass as a status even if bit error reaching an allowable number of bits occurs after at least one of a write or erase sequence is completed, the memory controller having an allowable bit changing function of changing an upper limit value of the allowable number of bits within a range of a number of bits correctable by a checking/correcting function, the non-volatile memory having a rewritable allowable bit storage section storing the upper limit value of the allowable number of bits.

2. The system according to claim 1, wherein the upper limit value of the allowable number of bits is changed based on a number of bit errors allowed as a pseudo pass.

3. The system according to claim 2, wherein the non-volatile memory includes: a status storage section storing a status and a number of bit errors allowed as the pseudo pass in a stares read, wherein the memory controller includes: an allowable bit change processing section reading the status and the number of bit errors allowed as the pseudo pass, comparing the number of bit errors allowed as the pseudo pass with a number of bits correctable by error checking/correcting function, and based on the comparison result, changing the upper limit value of the allowable number of bits within a range of the number of correctable bits, and writing the changed upper limit value of the allowable number of bits in the allowable bit storage section.

4. The system according to claim 1, wherein the upper limit value of the allowable number of bits is changed based on a number of rewrite times of the non-volatile memory.

5. The system according to claim 4, wherein the memory controller includes: a count section counting a number of rewrite times of the non-volatile memory; and an allowable bit change processing section changing the upper limit value of the allowable number of bits within a range of the number of correctable bits based on the count result, and writing the changed upper limit value of the allowable number of bits in the allowable bit storage section.

6. The system according to claim 3, wherein the rewritable storage section is provided outside a memory cell array of the non-volatile memory.

7. The system according to claim 4, wherein the rewritable storage section is provided outside a memory cell array of the non-volatile memory.

8. The system according to claim 5, wherein the rewritable storage section is provided outside a memory cell array of the non-volatile memory.

9. The system according to claim 3, wherein the rewritable storage section is provided in a memory cell array of the non-volatile memory.

10. The system according to claim 4, wherein the rewritable storage section is provided outside in a memory cell array of the non-volatile memory.

11. The system according to claim 5, wherein the rewritable storage section is provided in a memory cell array of the non-volatile memory.

12. The system according to claim 9, wherein the rewritable storage section exists in a redundancy page of the memory cell array, and the redundancy page exists outside a data area of one page.

13. The system according to claim 10, wherein the rewritable storage section exists in a redundancy page of the memory cell array, and the redundancy page exists outside a data area of one page.

14. The system according to claim 11, wherein the rewritable storage section exists in a redundancy page of the memory cell array, and the redundancy page exists outside a data area of one page.

15. The system according to claim 12, wherein the allowable number of bits is shown by any of the number of data "0" or "1" of the allowable bit storage section.

16. The system according to claim 13, wherein the allowable number of bits is shown by any of the number of data "0" or "1" of the allowable bit storage section.

17. The system according to claim 14, wherein the allowable number of bits is shown by any of the number of data "0" or "1" of the allowable bit storage section.

18. The system according to claim 1, wherein the upper limit value of the allowable number of bits is changed every block of the non-volatile memory.

19. The system according to claim 1, wherein the upper limit value of the allowable number of bits is changed every page of the non-volatile memory.

20. The system according to claim 1, wherein the non-volatile memory is a multi-value memory.

* * * * *